United States Patent
Zagozdson-Wosik et al.

(10) Patent No.: US 6,444,553 B1
(45) Date of Patent: Sep. 3, 2002

(54) JUNCTION FORMATION WITH DIFFUSION BARRIER FOR SILICIDE CONTACTS AND METHOD FOR FORMING

(75) Inventors: Wanda Zagozdson-Wosik; Jia Li, both of Houston, TX (US)

(73) Assignee: University of Houston, Houston, TX (US)

( * ) Notice: Subject to any disclaimer, the term of this patent is extended or adjusted under 35 U.S.C. 154(b) by 0 days.

(21) Appl. No.: 09/110,377

(22) Filed: Sep. 15, 1997

(51) Int. Cl.[7] ............................ H01L 21/28; H01L 21/44
(52) U.S. Cl. ................... 438/571; 438/514; 438/572; 438/581; 438/643; 438/664; 438/683
(58) Field of Search ................................ 438/514, 522, 438/523, 537, 541, 542, 571, 572, 573, 582, 581, 592, 642, 643, 648, 652, 669, 660, 663, 653, 664, 682, 683

(56) References Cited

U.S. PATENT DOCUMENTS 4,569,121 A * 2/1986 Lim et al. .................... 438/467
4,800,177 A * 1/1989 Nakamae .................... 438/627
5,432,129 A * 7/1995 Hodges ........................ 438/621

OTHER PUBLICATIONS

Cheng et all. "Ultra Shallow n+/p junctions Formed by Out–diffusion from TiSi2 with an Amorphous Silicon Buffer Layer", EDMS'94, pp. 8–7–25—8–7–27.*

Huang et al. "Ultra Shallow n+/p Junctions Formed by Out–diffussion from TiSi2 with an Amorphous Silicon Buffer Layer", 1994, EDMS'94, pp. 8–7–25 to 8–7–27.*

Sade et al. "Sputter deposition and characterization of TiB2/TiSi2 bilayer contact structure", 1997, Materials for Avanced Metallization, pp. 210–212.*

Chang Sik Choi et al. "Electrical Characteristics of TiB2 for ULSI Applications", Oct. 1992, IEEE, vol. 39, No. 10, pp. 2341–2345.*

Runyan, et al., "Ohmic Contacts, Schottky Barriers, and Interconnects," *Semiconductor Integrated Circuit Processing Technology*, Jul. 1990, p. 535–551.

* cited by examiner

*Primary Examiner*—Carl Whitehead, Jr.
*Assistant Examiner*—Maria Guerrero
(74) *Attorney, Agent, or Firm*—Baker Botts L.L.P.

(57) ABSTRACT

Method and apparatus are provided for a semiconductor device including a junction and contact having a diffusion barrier to control silicidation of a silicon substrate. A dopant is applied in excess of an amount required to form a junction and the dopant chemically reacts with a metal to form a compound which serves as a barrier layer to prevent silicidation in the substrate.

14 Claims, 4 Drawing Sheets

JUNCTION FORMATION WITH DIFFUSION BARRIER FOR SILICIDE CONTACTS AND METHOD FOR FORMING

RELATED APPLICATIONS

This application claims priority to U.S. application Ser. No. 60/026,017, filed Sep. 12, 1996.

FIELD OF THE INVENTION

This invention pertains to semiconductor integrated circuits and their fabrication. More particularly, a junction and contact having a diffusion barrier to control silicidation of a substrate is provided.

BACKGROUND OF THE INVENTION

The circuit elements of integrated circuits continue to decrease in size. Many processing operations are included in the manufacture of modem circuits. One of the common manufacturing processes is the deposition of metal or other conductive materials as a gate, interconnect or contact material. One of the requirements of conductive contact materials is that they withstand heating to a few hundred degrees while in contact with silicon. Under these conditions, many metal-silicon contacts cannot exist because the silicon and the metal react to form a silicide. The suicides generally have high electrical conductivity and in themselves make dependable and self-aligned silicon contacts, however. See, for example, *Semiconductor Integrated Circuit Processing Technology*, Addison-Wesley Publishing Co., 1990, pp. 535–549.

Therefore, suicides are used in place of metals in many circuits.

Another commonly used wafer fabrication operation is diffusion of dopants into a substrate. The first step is to deposit the dopant material on the substrate surface. The second step is to "drive" the dopant into the substrate by exposing the coated substrate to a selected high temperature for a selected time so as to achieve the desired diffusion depth. In this diffusion process, with the advent of increasingly large-scale integrated manufacturing, the need for ultra-shallow junctions in silicon has arisen. There is also a need to integrate this doping step with the formation of a contact. When a silicide is used to form the contact, there is need to form a diffusion barrier between the contact and the substrate, so as to control silicidation in the substrate material. It is known to use diffusion barriers to prevent undesirable materials from reaching parts of the circuit where a harmful effect results. Barriers have been categorized as passive or sacrificial. Passive layers are inert to the material on each side of the layer and thus will keep the two layers separated if they are completely effective. Often there is substantial diffusion of one or both components through the passive barrier, however. See *Semiconductor Integrated Circuit Processing Technology*, pp. 550–551.

Although many diffusion barriers are known, a better diffusion barrier to avoid silicidation of a silicon substrate having a silicide contact is needed.

SUMMARY OF THE INVENTION

A junction in a silicon substrate is provided along with a silicide contact. A conductive compound formed at the interface between the substrate and the contact is used to prevent silicidation in the substrate to the extent that the junction is decreased in effectiveness. A layer of a dopant, such as boron, is initially applied to the surface of the substrate by evaporation. Sufficient boron is applied such that residual boron is available on the surface of the substrate after a junction is formed in the silicon by diffusion. Then a cap of amorphous silicon is deposited over the boron by evaporation. At this point, two procedures may be used to form the junction and contact of this invention. In one embodiment, rapid thermal processing is used to form the junction by diffusion, then a titanium layer is deposited on the substrate and a silicon cap is then applied and rapid thermal processing is again used to form the final junction and contact. In another embodiment, after the first silicon layer is formed by evaporation above the boron layer, a titanium layer is formed, followed by a silicon layer and then rapid thermal processing is used to form the junction and contact at the same time. A preferred metal for forming the silicide is titanium, but other metals known to form a silicide and which form a compound with the dopant under the conditions of rapid thermal processing, such as tungsten, may be used. These metals that have lower resistivity than their suicides can also be deposited directly on the boron layer without the sacrificial silicon layer in order to form a metal contact instead of the suicides.

DETAILED DESCRIPTION OF THE PREFERRED EMBODIMENT

Figure 1A:
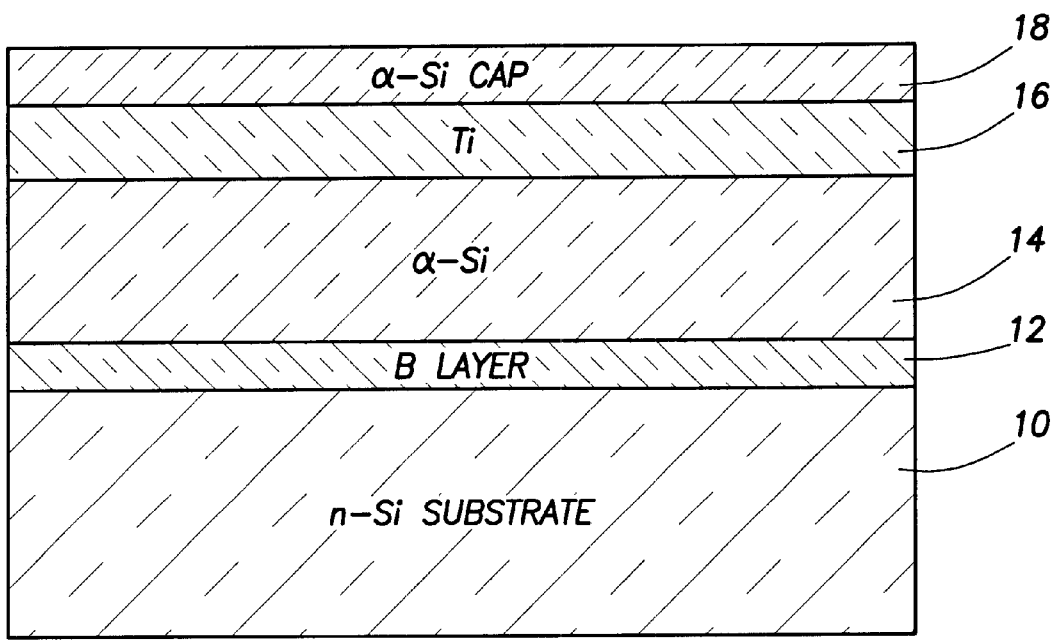
FIG. 1 is a sketch of the materials of this invention, (a) after deposition of four layers and before rapid thermal processing, and (b) after rapid thermal processing.

FIG. 1(a) shows silicon substrate 10 upon which boron layer 12, amorphous silicon layer 14, titanium layer 16 and a second amorphous layer 18 have been deposited according to one embodiment of this invention. Such deposition of layers is preferably made by electron beam evaporation, using techniques well-known in industry. Electron beam evaporation ensures selective doping using the lift-off technique in resist mask removal. All targets for the electron beam should be outgassed in the evaporator prior to each step of deposition. The evaporation rate of each material is calibrated to obtain controlled deposition rates for each of the materials. The silicon wafers should be cleaned using standard techniques.

Figure 1B:
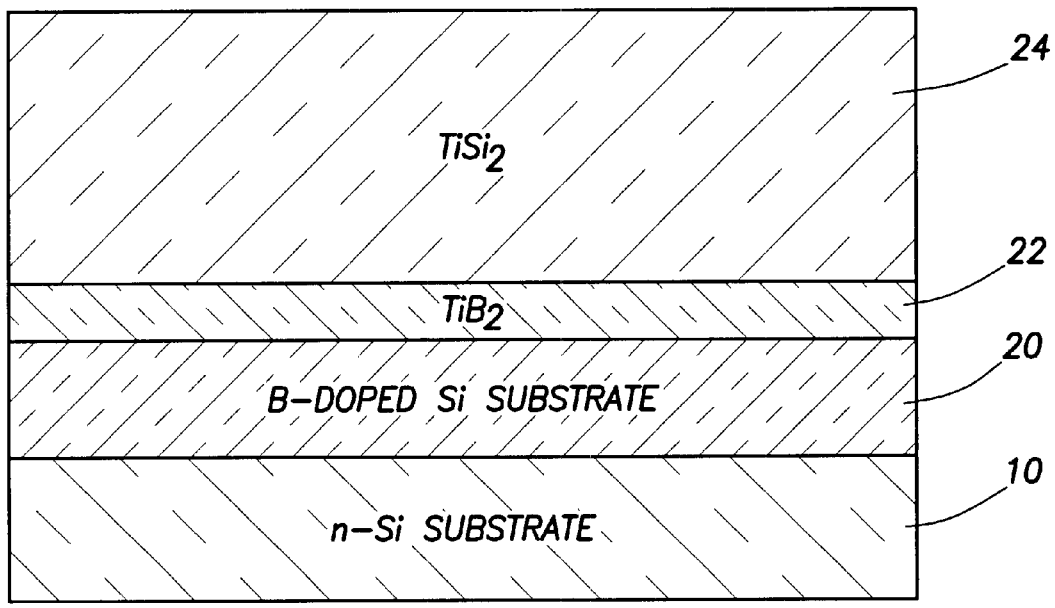

FIG. 1(b) shows the junction and contact of this invention. The substrate and layers shown in FIG. 1(a) have been subjected to rapid thermal processing (RTP) to form doped substrate zone forming a junction, titanium boride zone 22 resulting from a chemical reaction between titanium and boron at the temperature conditions existing during RTP and serving as a diffusion barrier, and contact layer 24 consisting of a silicide formed as the titanium atoms diffused from titanium layer 16 through amorphous silicon layers 14 and 18. Layer 24 has sufficient conductivity to be used as a contact, interconnect and similar uses. Junction 12 and contact 14 are normally patterned on substrate 10 using well-known lithographic techniques. In a different embodiment of the method of forming the contact and junction of FIG. 1(*b*), a first RTP step is applied after layers 12 and 14 of FIG. 1(*a*) are formed. This step causes formation of a doped zone such as of FIG. 1(*b*). Then a titanium layer and a silicon cap are applied and a second RTP step is carried out.

Figure 2:
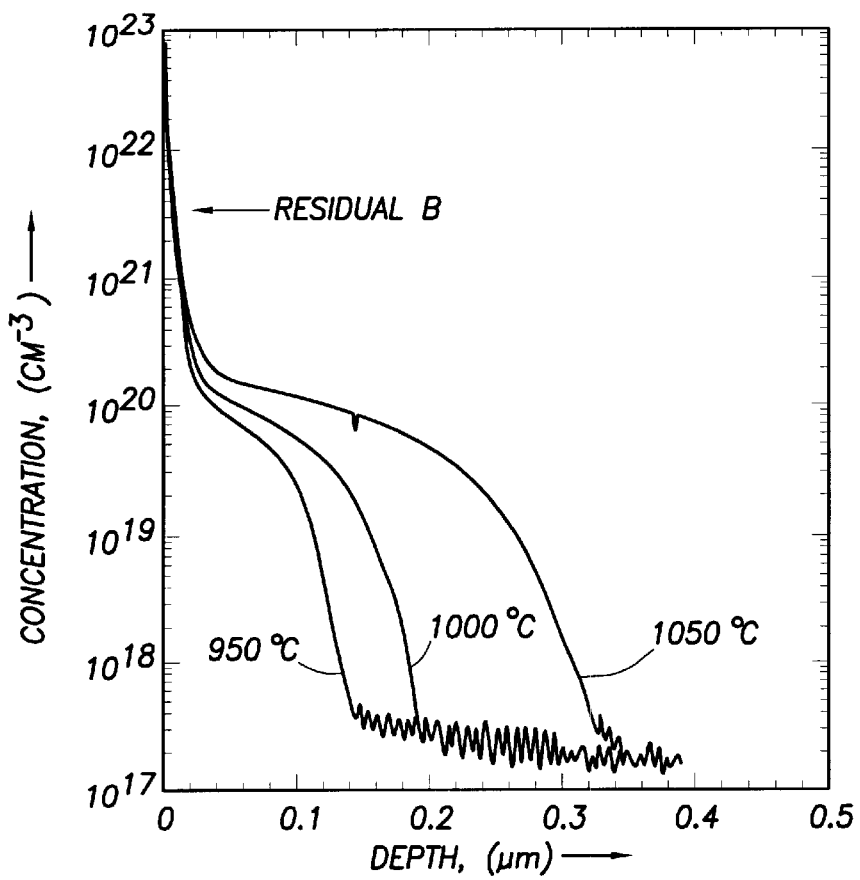
FIG. 2 is a SIMS profile of boron dopant in a diffused layer in silicon for three diffusion temperatures.

RTP in a neutral gas (nitrogen) atmosphere can be used to form shallow junctions in a substrate. A residual dopant layer can be left on the surface of the substrate. FIG. 2 shows the concentration of boron in a silicon substrate, as measured by Secondary Ion Mass Spectroscopy (SIMS). Note the residual boron left at and near the surface of the silicon. Sufficient boron should be left in excess to react with the metal used to form a siuicide in a contact above. The initial boron layer, before RTP has occurred, should be from about 10 angstroms to about 100 angstroms in thickness. If the layer is thinner, there is a chance that insufficient excess boron will be left to react with the metal used to form a silicide and act as a barrier to metal diffusion into the substrate. If the boron layer is too thick, the interface of the junction formed will not be as smooth and the formation of the layer will require extra time.

Figure 3:
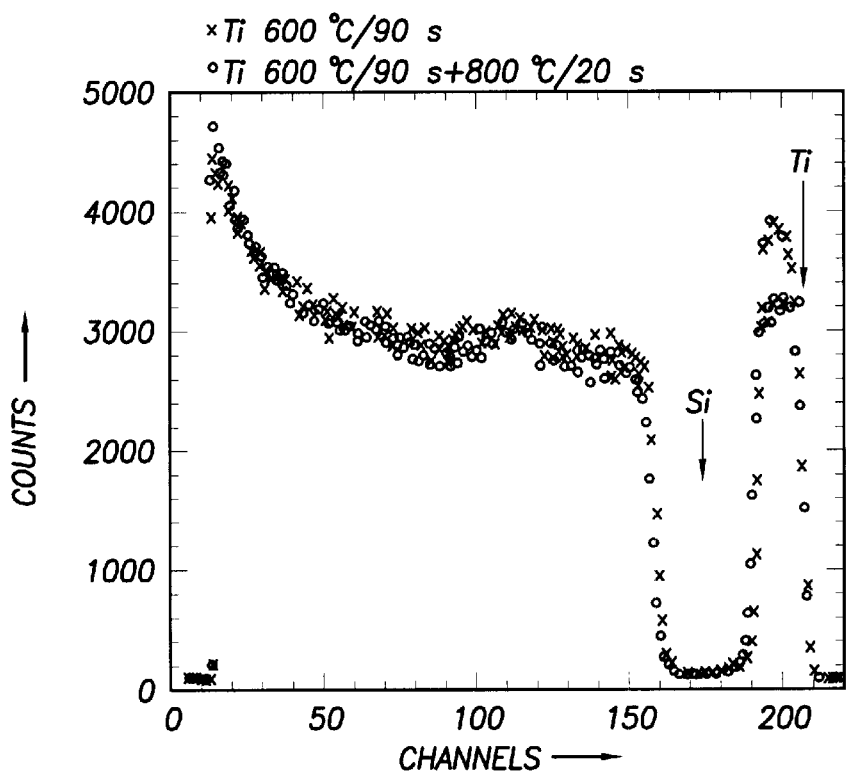
FIG. 3 is a graph of RBS counts for boron-doped substrate after conditions where silicidation could have occurred and showing the absence of silicon at the surface.

Referring to FIG. 3, the data are for a silicon substrate upon which a boron layer 30 angstroms thick was deposited. Diffusion then occurred by RTP at 900° C. for 10 seconds. Then a titanium layer was deposited to a thickness of 300 angstroms and annealing was performed at 600° C. for 90 seconds followed by 800° C. for 20 seconds. The Rutherford Backscattering (RBS) curve of FIG. 3 shows arrows at channels where silicon and titanium would be present if these elements were on the surface of the sample. No silicon is observed on the surface. This shows that silicidation had not occurred at the surface from the presence of the titanium layer, because of the presence of the boron layer which reacted with the titanium.

Figure 4:
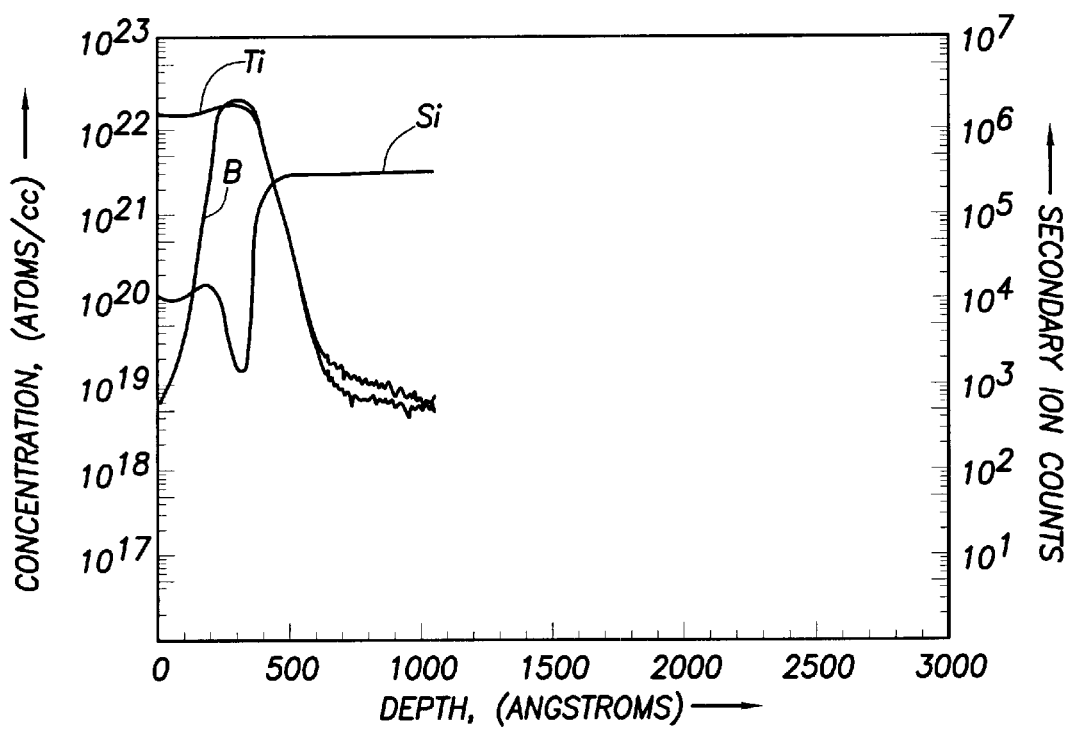
FIG. 4 is a graph of SIMS profiles for a sample having boron and titanium stacked layers after RTP.

FIG. 4 shows a SIMS profile for a sample of silicon substrate upon which a boron layer 50 angstroms thick was deposited followed by a titanium layer 300 angstroms thick. RTP at 1050° C. for 30 seconds was then applied. The SIMS profile shows that even after these conditions for high diffusion had been applied, the titanium has not diffused appreciably into the silicon substrate and the silicon has not moved appreciably into the titanium layer. The boron layer has been broadened, but the presence of boron has prevented the extensive silicidation which would have occurred in the absence of the boron. Also note that titanium has not diffused beyond boron in the substrate, which means that the junction formed by the boron dopant would not be destroyed by silicidation.

Figure 5:
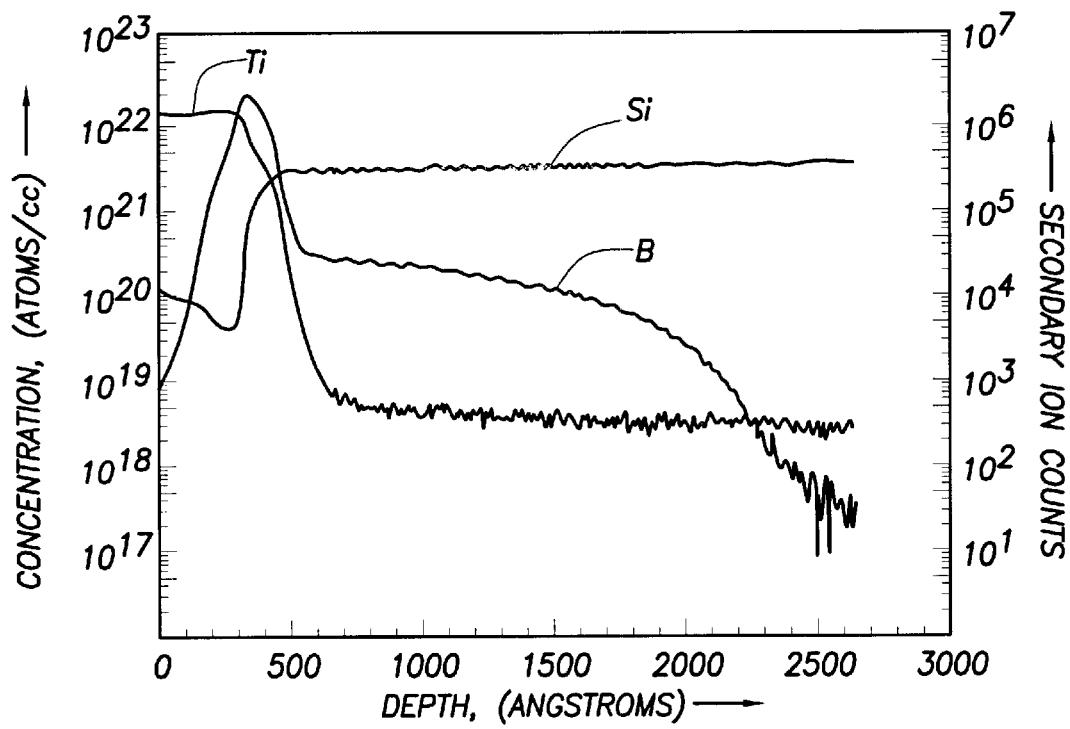
FIG. 5 is a graph of SIMS profiles for a sample having boron diffused followed by titanium deposition and annealing.

Referring to FIG. 5, SIMS profiles are shown for a sample which was formed by first depositing a boron layer 30 angstroms thick and applying RTP to form a junction. Note that the boron has diffused over 2000 angstroms into the substrate during the 10 second process. Then a titanium layer was deposited on the substrate to a thickness of 300 angstroms and RTP was applied at 800° C. for 20 seconds. The SIMS profile shows that, unlike known silicidation, the diffusion of silicon to the surface is only slight and that the diffusion depth of titanium into the substrate is negligible, much less than the depth of the prior boron diffusion. Therefore, even much more shallow junctions formed by boron would not be affected by silicidation caused by the titanium.

Figure 6:
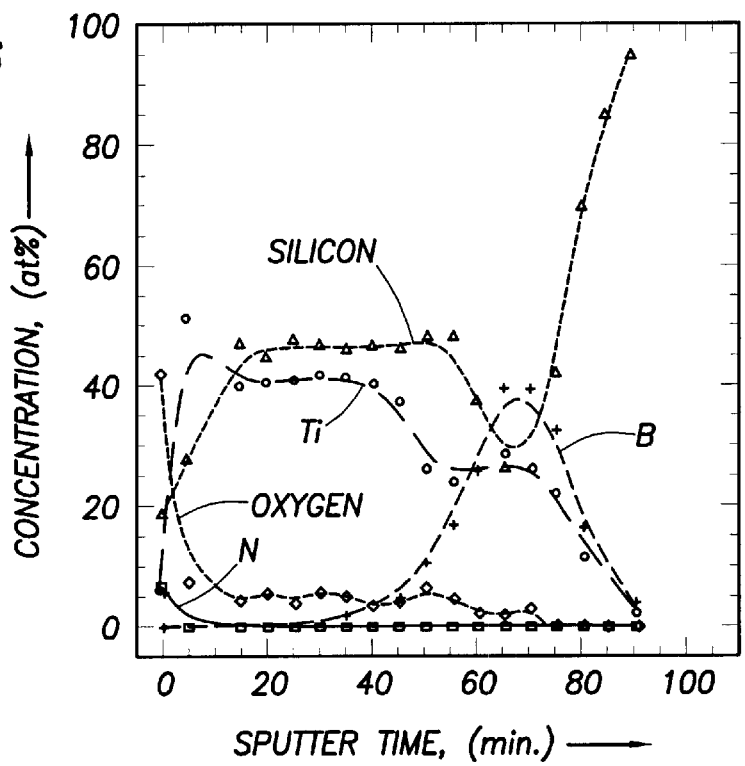
FIG. 6 is a graph of AES profiles for a sample prepared from a boron and silicon stacked structure and diffused followed by titanium and silicon deposition and a two-step annealing.

Regarding FIG. 6, the concentrations of various elements, as measured by Auger Electron Spectra (AES), as a function of sputtering times are shown. The sample was formed by depositing a 30 angstrom layer of boron, followed by a 650 angstrom layer of silicon followed by RTP diffusion at 900° C. for 10 seconds. Then a layer of titanium having a thickness of 300 angstroms was deposited and a silicon cap having a thickness of 70 angstroms was deposited over the titanium. RTP followed at 650° C. for 90 seconds and 900° C. for 20 seconds. Note that the silicon concentration and the titanium concentration near the surface (short sputtering times) show the presence of the silicide at the surface. The silicon concentration decreases somewhat approaching the surface of the substrate and then begins to increase sharply at the surface of the substrate. Note that the titanium concentration drops at the interface with the substrate, indicating little silicide formation in the substrate. More importantly, silicide formation does not extend farther into the substrate than does boron. The presence of boron at the surface ensures high concentrations, thus avoiding high contact resistance observed in scaled-down devices.

Figure 7:
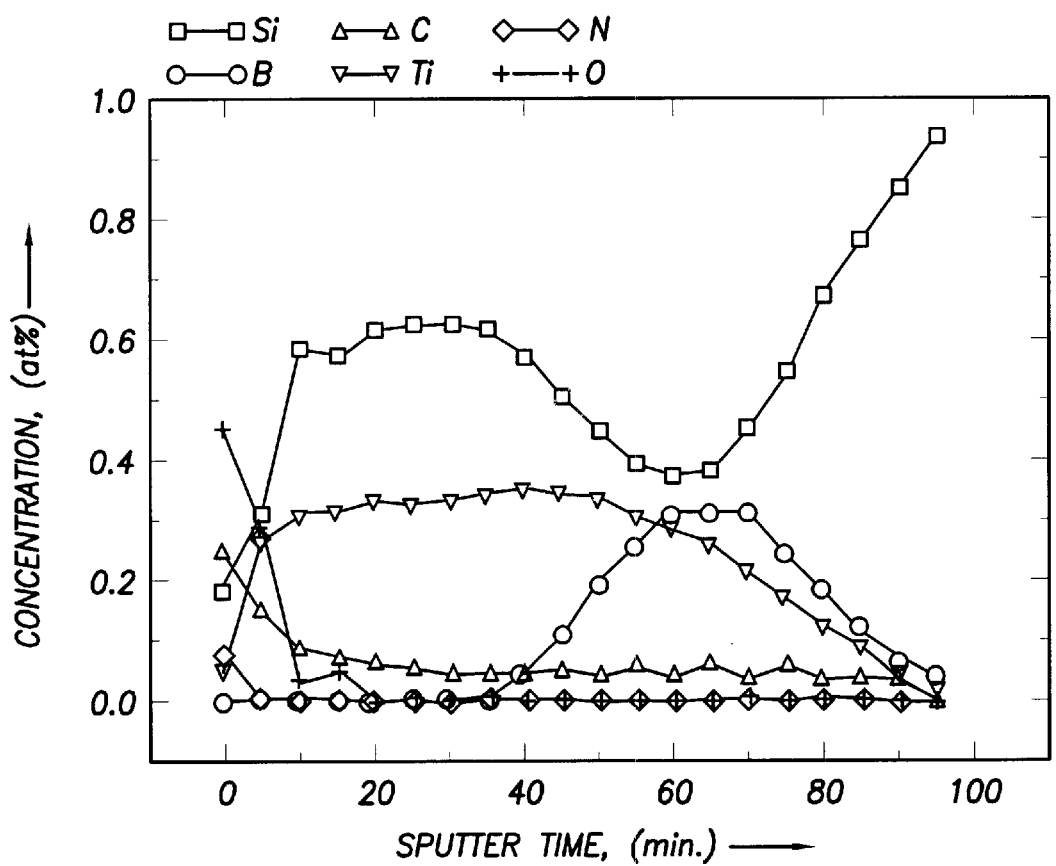
FIG. 7 is a graph of AES profiles for a sample prepared from a stacked structure of boron, silicon, titanium and silicon followed by a two-step annealing.

Referring to FIG. 7, a sample was prepared by first evaporating a 30 angstrom thick layer of boron, then a 650 angstrom thick layer of silicon, then a 300 angstrom layer of titanium and finally a 70 angstrom thick layer of silicon. No RTP was applied until all layers had been completed. RTP was then applied at 650° C. for 90 seconds followed by 900° C. at 20 seconds. The concentrations of the various atoms, as measured by AES, as a function of sputter time are shown in FIG. 7. Note that the interface between the layers and the substrate is indicated by the upward slope of silicon which occurred at about 60 minutes sputter time. Importantly, silicide formation in the layers above the substrate is indicated by high concentrations of silicon and titanium at small sputter times but in the substrate the concentration of titanium falls below that of boron, indicating that silicidation in the substrate would not cause deterioration of the junction.

The thicknesses of the various layers can vary over wide ranges. Preferably, the thickness of the boron layer will be from about 10 to about 100 angstroms, the first amorphous silicon cap will be from about 300 to about 800 angstroms, the titanium layer will be from about 250 to about 450 angstroms, and the final protective amorphous silicon cap will be from about 50 to about 100 angstroms. The thickness of these layers may be outside these ranges, however, and the method of this invention be applied.

Although doping with boron has been discussed heretofore, it should be understood that the same method can be used for doping of a substrate using arsenic and phosphorous. Metal-dopant compounds which are conductive can be formed for these elements under conditions which can be achieved in RTP.

The use of titanium to form a silicide has been discussed herein. It should be 30 understood that other metals known to form silicides can be used in place of titanium. A list of such suicides is shown, for example, on page 548 of the book *Semiconductor Integrated Circuit Processing Technology*, which is incorporated by reference herein. Tungsten silicide, may be used, for example. It is known that tungsten boride and tungsten arsenide can be formed. Tungsten can be used also as a plain metal contact using this invention, since metal-dopant compounds would prevent silicide formation; thus, lower resistance can be obtained.

What is claimed is:

1. A method for forming a junction and contact on a silicon substrate, comprising the steps of:

applying a selected amount of dopant to a silicon substrate, the amount being sufficient to leave an excess of dopant on the surface when the junction is formed from the dopant;

applying a first layer of amorphous silicon over the dopant;

applying a first rapid thermal processing to form the junction by diffusion;

applying a layer of a metal which forms a silicide;

applying a second amorphous silicon layer; and applying a second rapid thermal processing to form the contact and a barrier layer formed from reaction of the dopant and the metal which forms a silicide.

2. The method of claim 1 wherein the metal which forms a silicide is titanium.

3. The method of claim 1 wherein the layers are deposited by evaporation at a controlled rate.

4. The method of claim 1 wherein the contact and junction are patterned on the substrate.

5. The method of claim 1 wherein the dopant is boron.

6. The method of claim 5 wherein the boron is from about 10 angstroms to about 100 angstroms in thickness.

7. A method for forming a junction and contact on a silicon substrate, comprising the steps of:

applying a layer of dopant to a silicon substrate, the amount being sufficient to leave an excess of dopant on the substrate when the junction is formed from the dopant;

applying a first layer of amorphous silicon over the dopant;

applying a layer of a metal which forms a silicide over the first layer of amorphous silicon;

applying a second layer of amorphous silicon over the metal; and rapid thermal processing to form the contact, junction and a barrier layer formed from a reaction between the dopant and the metal which forms a silicide.

8. The method of claim 7 wherein the metal which forms a silicide is titanium.

9. The method of claim 7 wherein the layers are deposited by evaporation at a controlled rate.

10. The method of claim 7 wherein the contact and junction are patterned on the substrate.

11. The method of claim 7 wherein the dopant is boron.

12. The method of claim 11 wherein the boron is from about 10 angstroms to about 100 angstroms in thickness.

13. A method for forming a junction and contact on a silicon substrate, comprising the steps of:

applying a selected amount of a dopant to a silicon substrate, the amount being sufficient to leave an excess of dopant on the surface when the junction is formed from the dopant;

applying a layer of a metal; and applying a rapid thermal processing to form the junction and a barrier layer from reaction of the dopant and the metal.

14. The method of claim 13 wherein the metal is tungsten.

* * * * *